United States Patent
Yantchev

(10) Patent No.: US 11,750,168 B2
(45) Date of Patent: *Sep. 5, 2023

(54) TRANSVERSELY-EXCITED FILM BULK ACOUSTIC RESONATOR WITH TETHER-SUPPORTED DIAPHRAGM

(71) Applicant: Murata Manufacturing Co., Ltd., Nagaokakyo (JP)

(72) Inventor: Ventsislav Yantchev, Sofia (BG)

(73) Assignee: Murata Manufacturing Co., Ltd., Nagaokakyo (JP)

(*) Notice: Subject to any disclaimer, the term of this patent is extended or adjusted under 35 U.S.C. 154(b) by 6 days.

This patent is subject to a terminal disclaimer.

(21) Appl. No.: 17/584,324

(22) Filed: Jan. 25, 2022

(65) Prior Publication Data

US 2022/0149805 A1 May 12, 2022

Related U.S. Application Data

(63) Continuation of application No. 17/460,131, filed on Aug. 27, 2021, now Pat. No. 11,271,540, which is a (Continued)

(51) Int. Cl.
*H03H 9/02* (2006.01)
*H03H 9/54* (2006.01)
*H03H 9/205* (2006.01)

(52) U.S. Cl.
CPC .... *H03H 9/02015* (2013.01); *H03H 9/02157* (2013.01); *H03H 9/02228* (2013.01); *H03H 9/205* (2013.01); *H03H 9/547* (2013.01)

(58) Field of Classification Search
CPC ........... H03H 9/02015; H03H 9/02157; H03H 9/02228; H03H 9/205; H03H 9/547;
(Continued)

(56) References Cited

U.S. PATENT DOCUMENTS

| 5,204,575 A | 4/1993 | Kanda et al. |
| 5,274,345 A | 12/1993 | Gau |

(Continued)

FOREIGN PATENT DOCUMENTS

| WO | 2016017104 | 2/2016 |
| WO | 2018003273 | 1/2018 |

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Rakesh B Patel
*Assistant Examiner* — Jorge L Salazar, Jr.
(74) *Attorney, Agent, or Firm* — ArentFox Schiff LLP

(57) ABSTRACT

An acoustic resonator device includes a substrate and a piezoelectric plate. A first portion of the piezoelectric plate is on the substrate. A second portion of the piezoelectric forms a diaphragm suspended over a cavity in the substrate. An interdigital transducer (IDT) is on a surface of the piezoelectric plate, the IDT including first and second busbars on the first portion and interleaved IDT fingers on the diaphragm. A plurality of tethers support the diaphragm over the cavity, each tether providing an electrical connection between a corresponding one of the interleaved IDT fingers and one of the first and second busbars.

20 Claims, 7 Drawing Sheets

Related U.S. Application Data continuation of application No. 17/108,984, filed on Dec. 1, 2020, now Pat. No. 11,271,539.

(60) Provisional application No. 63/067,326, filed on Aug. 19, 2020.

(58) Field of Classification Search
CPC ........... H03H 9/02102; H03H 9/02133; H03H 9/172; H03H 9/171; H03H 9/02007
USPC .......................................... 333/133, 193–196
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Allen et al. |
| 5,729,186 A | 3/1998 | Seki et al. |
| 5,853,601 A | 12/1998 | Krishaswamy |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,271,539 B1 * | 3/2022 | Yantchev ........... H03H 9/02157 |
| 11,271,540 B1 * | 3/2022 | Yantchev ........... H03H 9/02133 |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0274184 A1 * | 11/2012 | Stephanou ........... H03H 9/0207 29/25.35 |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |

(56) References Cited

U.S. PATENT DOCUMENTS

| | | |
|---|---|---|
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1 | 8/2020 | Pensala |
| 2020/0313645 A1 | 10/2020 | Caron |
| 2020/0350891 A1 | 11/2020 | Turner |
| 2021/0013859 A1 | 1/2021 | Turner et al. |
| 2021/0265978 A1 | 8/2021 | Plesski et al. |
| 2021/0328574 A1 | 10/2021 | Garcia |
| 2021/0351762 A1 | 11/2021 | Dyer et al. |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja. 4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned on thin film ZnO, Ph.D. thesis, Feb. 2016, Indian Institute of technology Guwahati, Assam, India Feb. 2016.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

* cited by examiner

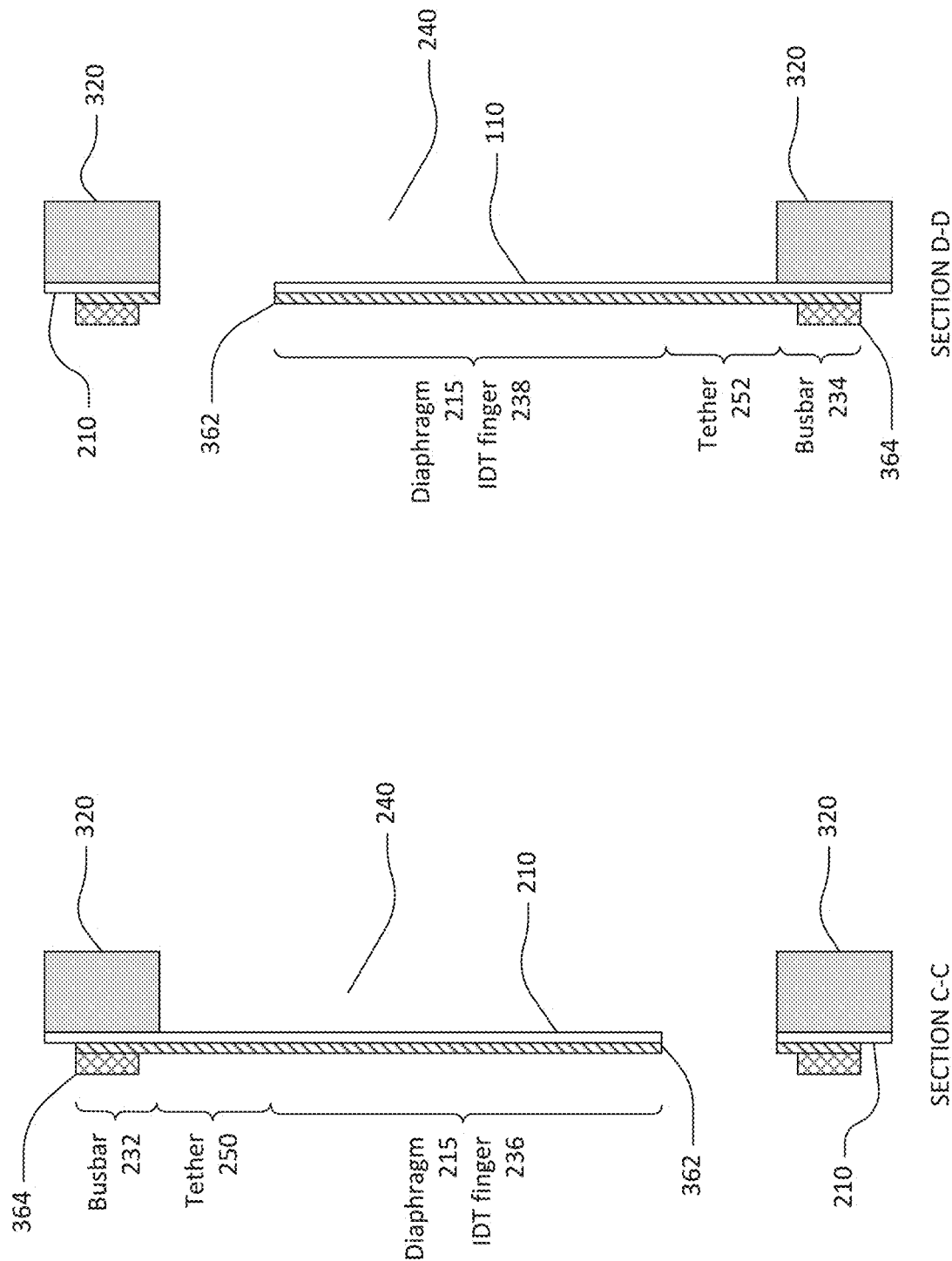

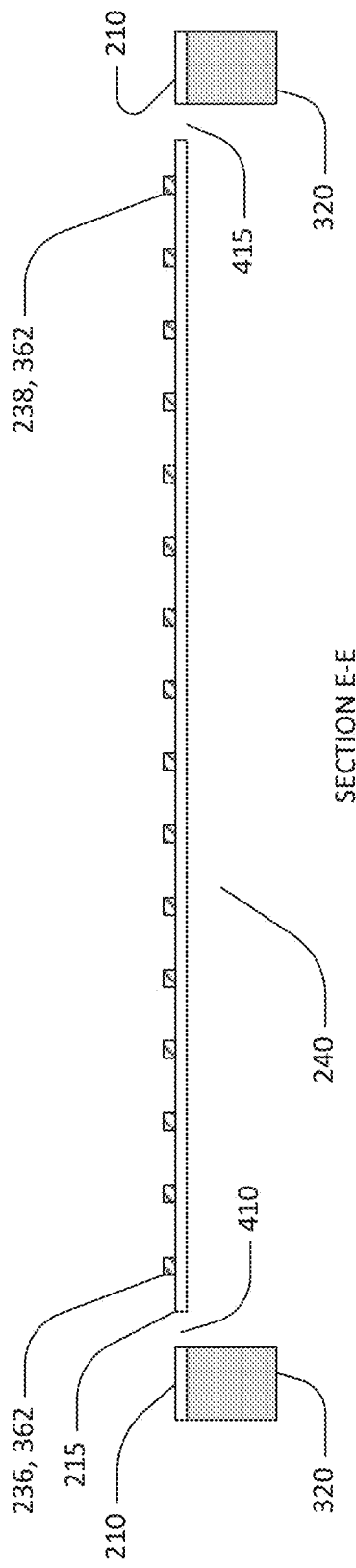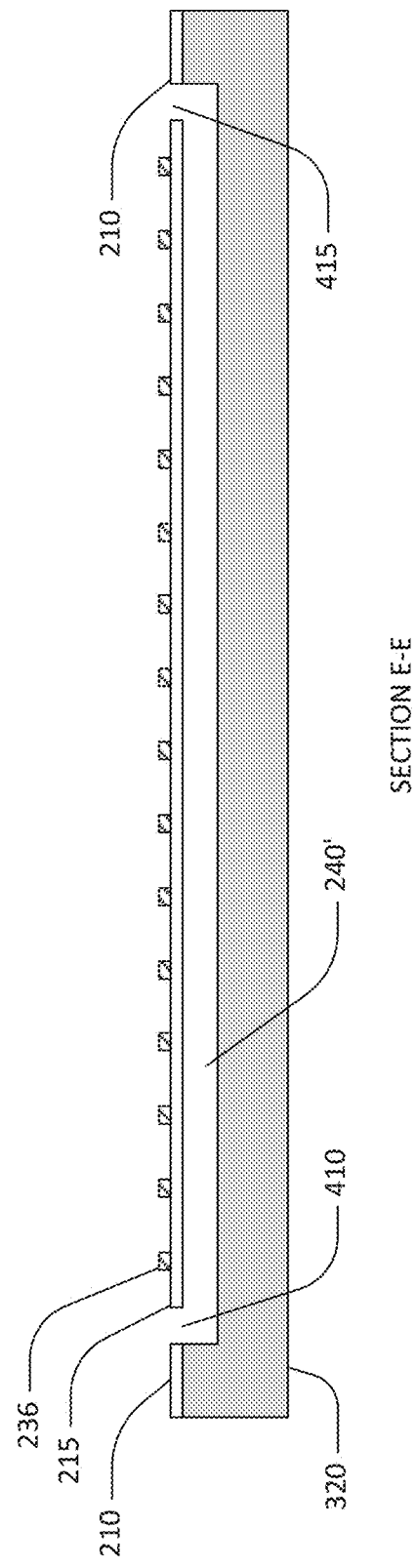

TRANSVERSELY-EXCITED FILM BULK ACOUSTIC RESONATOR WITH TETHER-SUPPORTED DIAPHRAGM

RELATED APPLICATION INFORMATION

This patent is a continuation of application Ser. No. 17/460,131, filed Aug. 27, 2021, entitled TRANSVERSELY-EXCITED FILM BULK ACOUSTIC RESONATOR WITH TETHER-SUPPORTED DIAPHRAGM, which is a continuation of application Ser. No. 17/108,984, filed Dec. 1, 2020, entitled TRANSVERSELY-EXCITED FILM BULK ACOUSTIC RESONATOR WITH TETHER-SUPPORTED DIAPHRAGM, which claims priority to provisional patent application 63/067,326, filed Aug. 19, 2020, entitled XBAR WITH TETHER-SUPPORTED DIAPHRAGM, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 3A is a schematic cross-sectional view of the XBAR with a tether-supported diaphragm at a section C-C defined in FIG. 2.

FIG. 3B is a schematic cross-sectional view of the XBAR with a tether-supported diaphragm at a section D-D defined in FIG. 2.

FIG. 4A is a schematic cross-sectional view of the XBAR with a tether-supported diaphragm at a section E-E defined in FIG. 2.

FIG. 4B is an alternative schematic cross-sectional view of the XBAR with a tether-supported diaphragm at a section E-E defined in FIG. 2.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
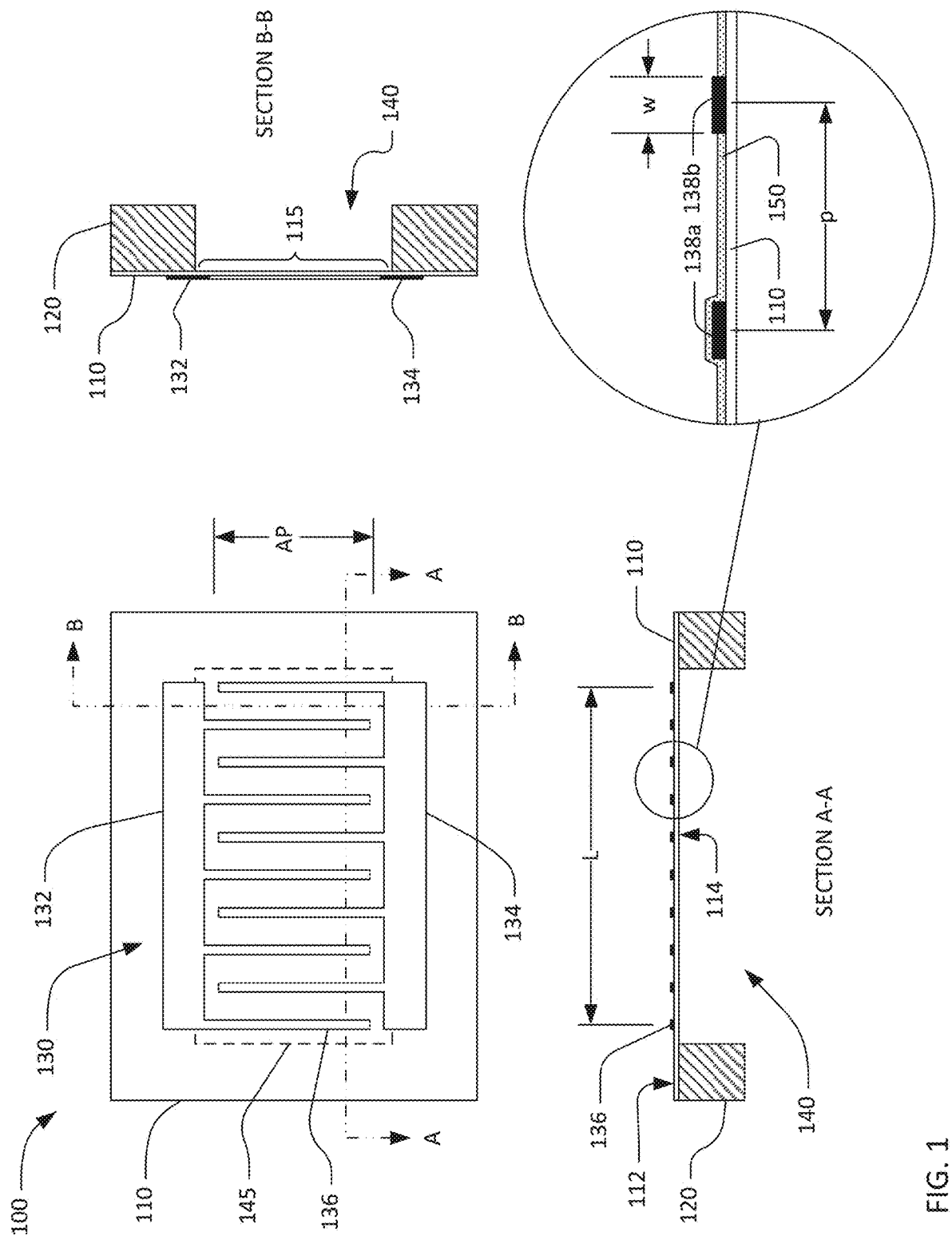
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR resonators such as the resonator 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115 (as shown in FIG. 4B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view, a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide, alumina, or silicon nitride. A thickness of the front side dielectric layer 150 is typically less than about one-third of the thickness of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness of the piezoelectric plate 210. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width w. The thickness of the busbars (132, 134) of the IDT may be the same as, or greater than, the thickness tm of the IDT fingers.

Figure 2:
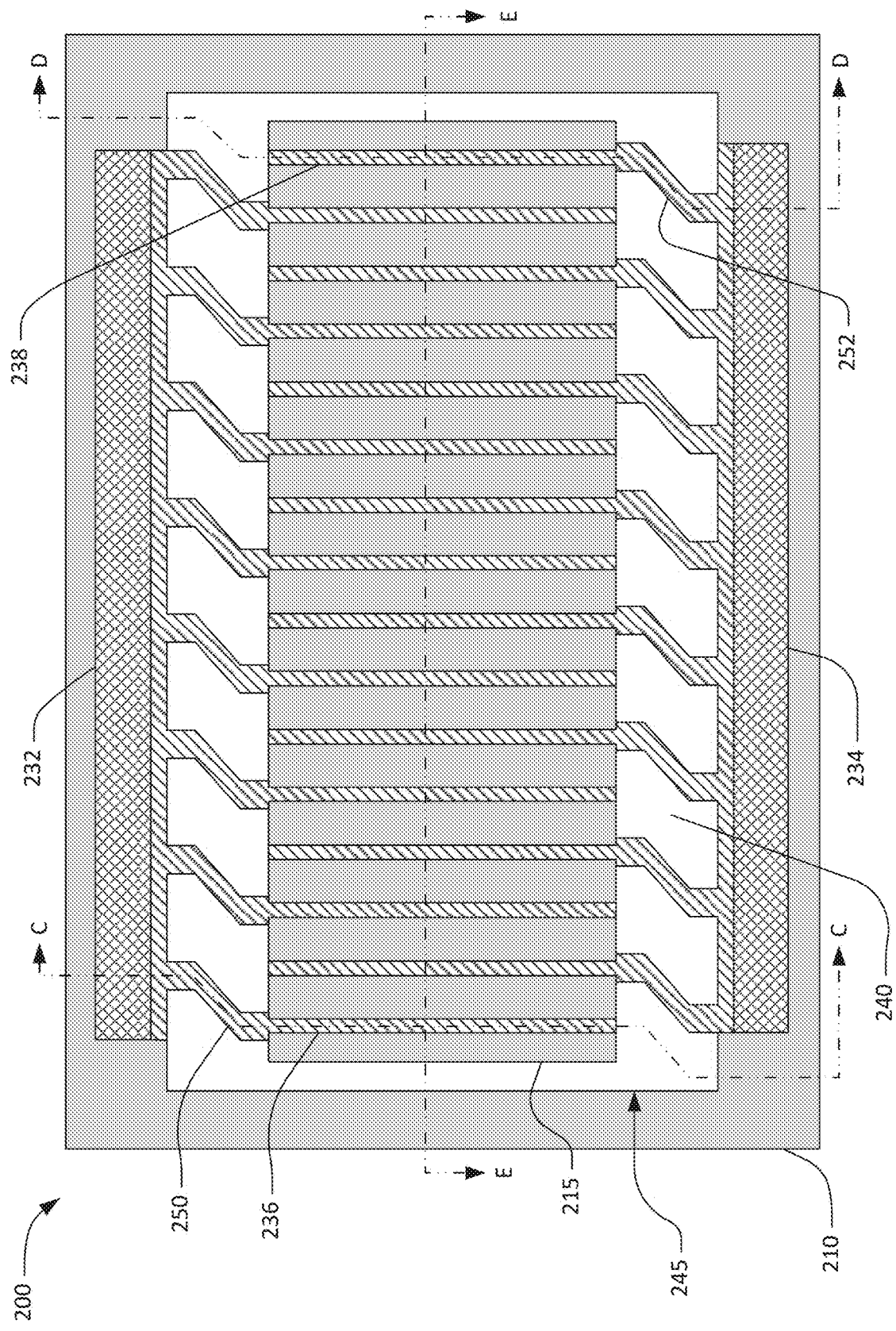
FIG. 2 is a plan view of an XBAR with a tether-supported diaphragm.

FIG. 2 is a plan view of an XBAR 200 with a tether-supported diaphragm. Like the XBAR 100 of FIG. 1, the XBAR 200 has a piezoelectric plate 210. A cavity 240 having a perimeter 245 is formed in a substrate (not visible) beneath the piezoelectric plate 210. A first portion (i.e. the portion outside of the cavity perimeter 245) of the piezoelectric plate 210 is attached to the substrate. Another portion of the piezoelectric plate 210 forms a diaphragm 215 suspended over the cavity 240. Unlike the diaphragm 115 of FIG. 1, the diaphragm 215 is not contiguous with the rest of the piezoelectric plate 210. Rather, the diaphragm 215 is separated from the piezoelectric plate by space open to the cavity 240. The open space is bridged only by a plurality of tethers, of which tethers 250 and 252 are identified in FIG. 2.

The tethers, such as tethers 250, 252, serve three purposes. First, the tethers provide mechanical support to suspend the diaphragm 215 over the cavity 240. Second, the tethers provide, by flexing, a means to absorb stresses placed on the diaphragm by changes in the device temperature. Third, the tethers provide electrical and thermal connections from first and second IDT busbars 232, 234 to the interleaved IDT fingers (of which only IDT fingers 236, 238 are identified in FIG. 2) disposed on the diaphragm 215. The first and second busbars 232, 234 are disposed on the first portion (the portion attached to the substrate) of the piezoelectric plate 210 on opposite sides of the cavity 240. Since each IDT finger must be connected to one of the busbars 232, 234, there is a one-to-one correspondence between IDT fingers and tethers. Alternate IDT fingers are connected to either busbar 232 or busbar 234 via respective tethers.

FIG. 3A and FIG. 3B are cross-sectional views of the XBAR 200 at sections C-C and D-D, respectively. As identified in FIG. 2, sections C-C and D-D are not planar. Section C-C follows a path along the center of tether 250 and IDT finger 236. Section D-D follows a path along the center of tether 252 and IDT finger 238.

Referring back to FIG. 3A and FIG. 3B, the piezoelectric plate 210 is attached to a substrate 320. The piezoelectric plate 210 may be single-crystal lithium niobate, lithium tantalate, or some other piezoelectric material. The orientation of the axes of the piezoelectric plate 210 are known and consistent. The piezoelectric plate 210 may be Z-cut, rotated Z-cut, rotated YX cut, or some other orientation. The substrate 320 may be silicon or some other material that can be anisotropically etched to form the cavity 240.

The diaphragm 215 is a portion of the piezoelectric plate 210. The IDT fingers 236/238 are formed by a first conductor level 362. The first conductor level 362 may be one or more layers of metal as previously described. The diaphragm 215 is suspended over the cavity 240 and supported by the tethers 250, 252. The tethers 250, 252 are formed by portions of the piezoelectric plate 210 and the first conductor level 362. A second conductor level 364 may be formed over all or portions of the busbars 232, 234 to improve thermal and electric conductivity.

FIG. 4A and FIG. 4B are alternative cross-sectional views of the XBAR 200 at section E-E defined in FIG. 2. These views of the XBAR 200 are comparable to the cross-sectional view A-A of the XBAR 100 shown in FIG. 1.

Portions of the piezoelectric plate 210 are attached to and supported by the substrate 320. A portion of the piezoelectric plate 210 forms the diaphragm 215 suspended over a cavity 240, 240' formed in the substrate 320. Unlike the XBAR 100 of FIG. 1, the diaphragm 215 of the XBAR 200 is not contiguous with the supported portions of the piezoelectric plate 210, but is separated from the supported portions of the piezoelectric plate 210 by spaces 410, 415. Interleaved IDT fingers, such as fingers 236, 238, are disposed on the diaphragm 215. The IDT fingers are formed of a first conductor level 362.

In FIG. 4A, the cavity 240 penetrates completely though the substrate 320. In FIG. 4B, the cavity 240' is a recess in the substrate 320. In this case, the cavity 240' may be formed by etching the substrate using an etchant introduced through the spaces around the diaphragm 215 and spaces between the tethers (not visible in FIG. 4A or 4B).

Although not shown in FIG. 3A, FIG. 3B, FIG. 4A, and FIG. 4B, the XBAR 200 may include one or more dielectric layers. For example, the XBAR 200 may include a bonding layer disposed between the substrate 320 and the piezoelectric plate 210. When the substrate is silicon, the bonding layer may be, for example, silicon dioxide. When a bonding layer is present between the substrate 320 and the piezoelectric plate 210, the bonding layer may remain or be removed from the back side (i.e. the side facing the cavity 240) of the diaphragm 215.

When multiple XBARs are connected in a ladder filter circuit, a dielectric frequency setting layer may be formed over the diaphragms and IDT fingers of shunt resonators to lower the resonance frequencies of the shunt resonators relative to the resonance frequencies of series resonators. Further, a thin passivation dielectric layer may be applied over most or all of the XBAR 200 to passivate and seal the surface.

Figure 5:
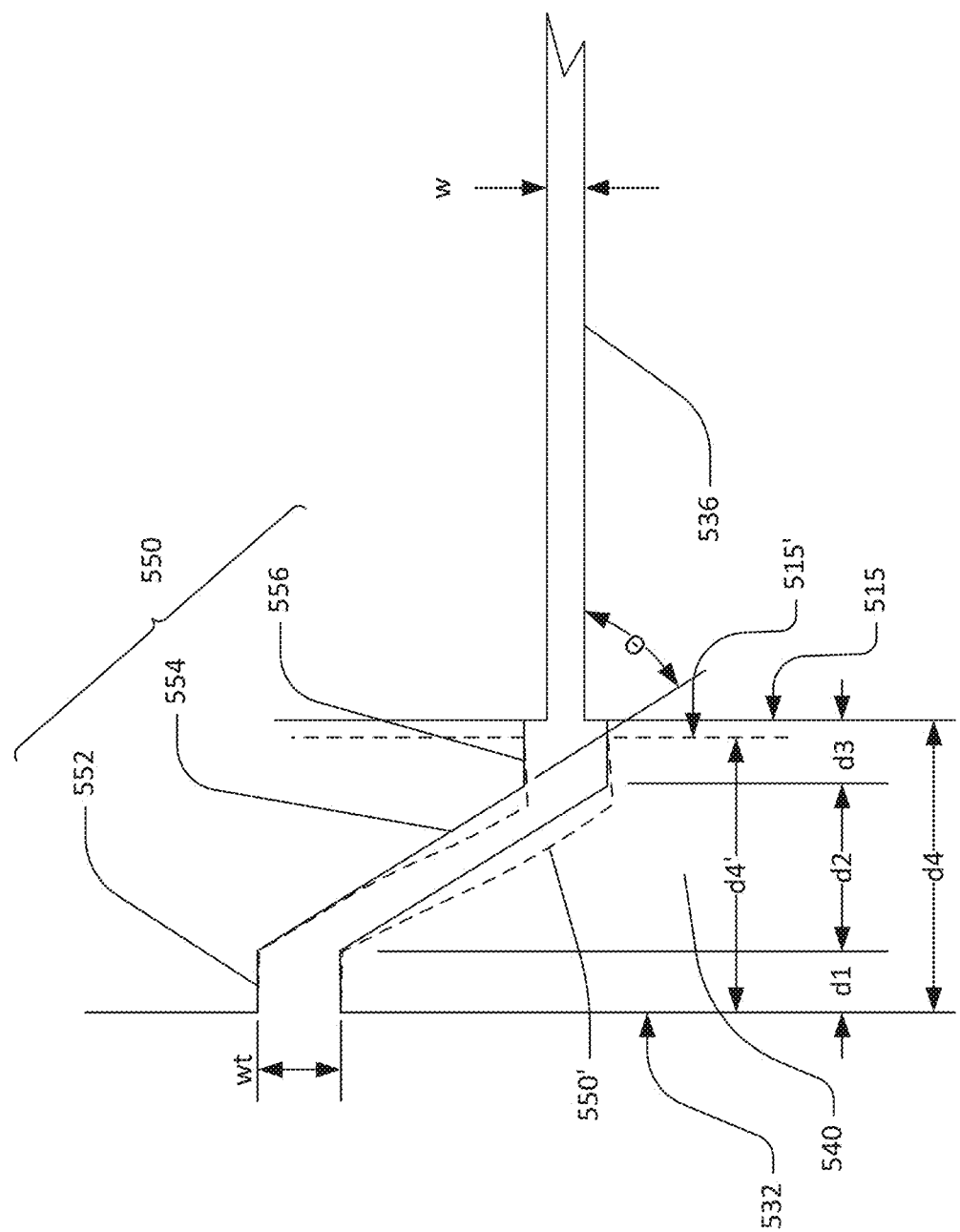
FIG. 5 is a schematic plan view illustrating flexion of a single tether.

FIG. 5 is an expanded plan view of a single tether 550. The line 515 is the edge of a diaphragm, and the line 532 is the edge of an IDT busbar and cavity. The region between the edge of the diaphragm 515 and the edge of the busbar 532 is a space open to a cavity 540 beneath the diaphragm. A plurality of tethers, including tether 550, span this space to hold the diaphragm 515 suspended over the cavity 540. The tether 550 provides electric and thermal connections between the busbar 532 and an IDT finger 536 disposed on the surface of the diaphragm 515.

The tether 550 includes a first segment 552 extending from the busbar 532, a third segment 556 extending from the diaphragm 515, and a second segment 554 connecting the first and third sections 552, 556. The second segment 554 is configured to flex in the plane of the diaphragm. To this end, the second segment 554 forms an oblique angle with respect to the side of the busbar 532 and the long direction of the IDT finger 536, which is to say the second segment 554 is not parallel to or perpendicular to either the side of the busbar 532 and the long direction of the IDT finger 536. For example, the angle θ between the side of the second segment 554 and the long direction of the IDT finger 536 may be 30 to 60 degrees.

In the example of FIG. 5, the first segment 552 extends perpendicularly from the edge of the busbar 532. The first segment 552 may extend from the side of the busbar 532 at some other angle. The first segment 552 may not be present, in which case the second segment 554 will extend from the side of the busbar 532 at an oblique angle.

In the example of FIG. 5, the third segment 556 extends perpendicularly from the edge of the diaphragm 515 and is colinear with the corresponding IDT finger 536. The third segment 556 may extend from the side of the diaphragm 515 at some other angle. The third segment 556 may not be present, in which case the second segment 554 will extend from the side of the diaphragm 515 at an oblique angle.

The distance, at a nominal temperature, between the side of the busbar 532 and the side of the diaphragm 515 is the dimension d4, which is the total distance spanned by the tether 550. The second segment 554 of the tether 550 spans a distance d2, which is greater than or equal to 50% of d4. In other words, d2≥d1+d3, where d1 and d3 are that distances spanned by the first and third tether segments 552, 556. Either or both of d1 and d3 may be zero. All of d1, d2, d3, and d4 are measured perpendicular to the side of the busbar 532.

The tether 550 may have some shape other than three straight sections. For example, some or all of the corners where the segments 552, 554, 556 intersect may be rounded. The tether 550 may be continuously curved, in which case at least a potion of the curved tether forms an oblique angle with respect to the side of the busbar 532 and the long direction of the IDT finger 536.

When an XBAR is used in a filter, some power is dissipated on the diaphragm due to resistive losses in the IDT fingers and acoustic or viscose losses in the IDT fingers and the diaphragm itself. The primary path for removing heat from the diaphragm is conduction along the IDT fingers to the busbar and then to the device substrate. The presence of tethers increases the length of the heat flow path from the diaphragm to the substrate compared to a conventional XBAR. To reduce the impact of the longer heat flow path, the width (dimension wt in FIG. 5) of the tethers may be larger than the width (dimension w in FIG. 5) of the IDT fingers. The width of the tethers may be, for example, p/2, where p is the pitch of the IDT.

All of the components of an XBAR have a respective temperature coefficient of expansion (TCE). A preferred substrate for XBAR devices is a silicon wafer, which has low cost and well-developed processes for forming cavities. However, the TCE of silicon is substantially lower than the TCE of lithium niobate or lithium tantalate, which are the preferred materials for the piezoelectric plate. The expansion or contraction of the diaphragm of an XBAR in response to a change in temperature will be greater in magnitude than the expansion or contraction of the surrounding area (which is dominated by the low TCE of the silicon substrate). The difference in expansion or contraction can cause bowing or rippling of the diaphragm.

In FIG. 5, the dashed line 515' represents the position of the edge of the diaphragm (relative to the edge of the busbar 532) after a temperature increase of 25 degrees Celsius. The dimension d4' is the new distance from the edge of the busbar 532 to the edge of the diaphragm 515', which is less than the original distance d4. The new position and shape of the tether 550' is shown in dashed lines. The tether 550' has flexed to absorb the change in the distance from the edge of the busbar to the edge of the diaphragm.

Figure 6:
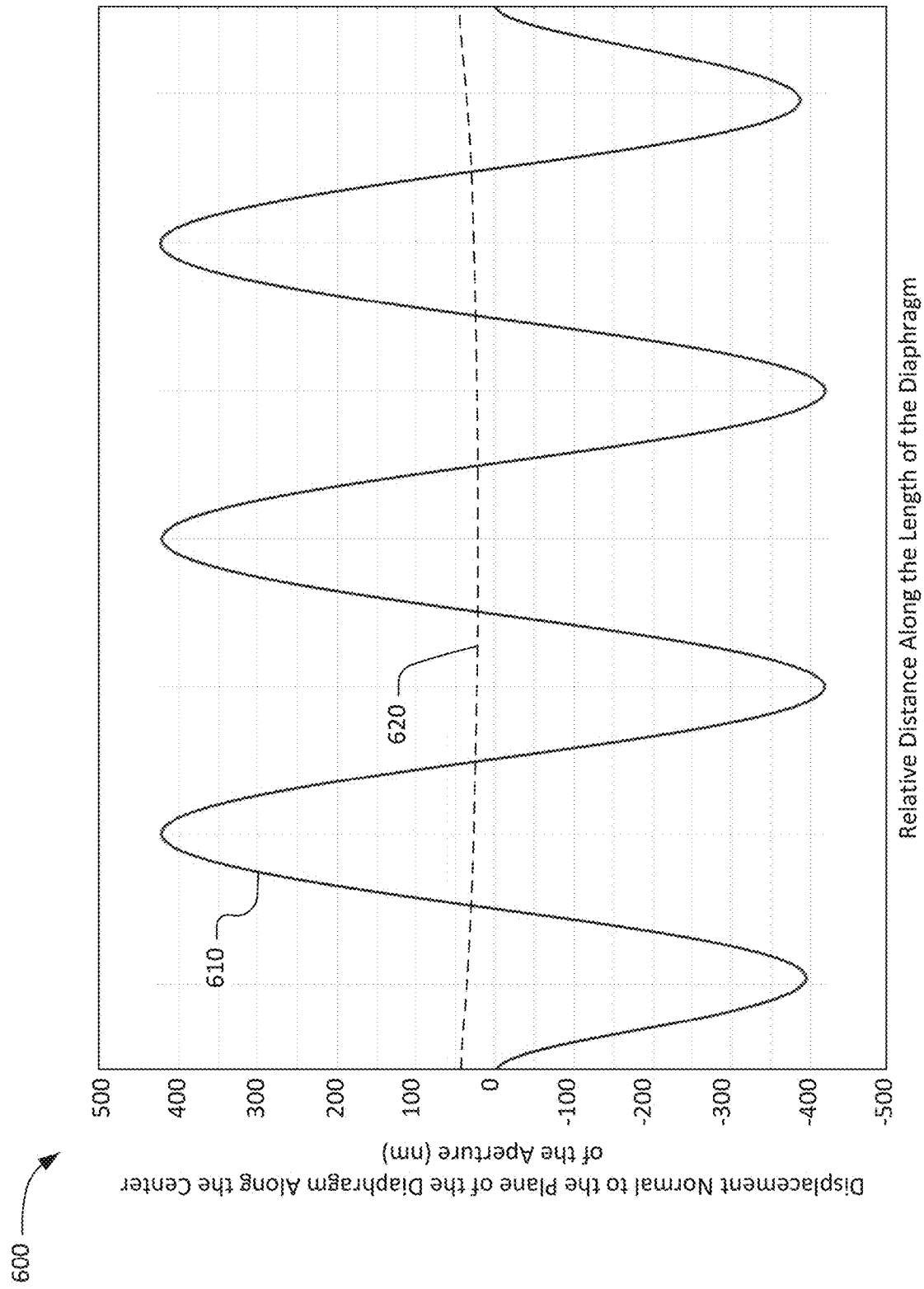
FIG. 6 is a graph of the displacement of the diaphragm of a conventional XBAR and a tether-supported diaphragm due to a twenty-degree temperature change.

FIG. 6 is a graph of the displacement of the diaphragm of a conventional XBAR and a tether-supported diaphragm due to a twenty-degree temperature change. Specifically, the solid line 610 is a plot of the displacement normal to the plane of the diaphragm for a diaphragm that is fully contiguous with the rest of the piezoelectric plate as shown in FIG. 1. A temperature change of 20 degrees causes the diaphragm to ripple with a peak-to-peak amplitude of 850 nm. The displacement along the center of the diaphragm was determined by simulation using a finite element method. In this example, the aperture and length of the IDT are 50 microns and 325 microns, respectively.

The dashed line 620 is a plot of the displacement normal to the plane of the diaphragm for a tether supported diaphragm as shown in FIG. 2. A temperature change of 20 degrees causes the diaphragm to curl up about 40 nm at the ends of the IDT. The difference between the solid line 610 and the dashed line 620 is evidence of the effectiveness of the tethers for absorbing differences in the TCE of the diaphragm and the substrate and thus reducing stress in the diaphragm.

Description of Methods

Figure 7:
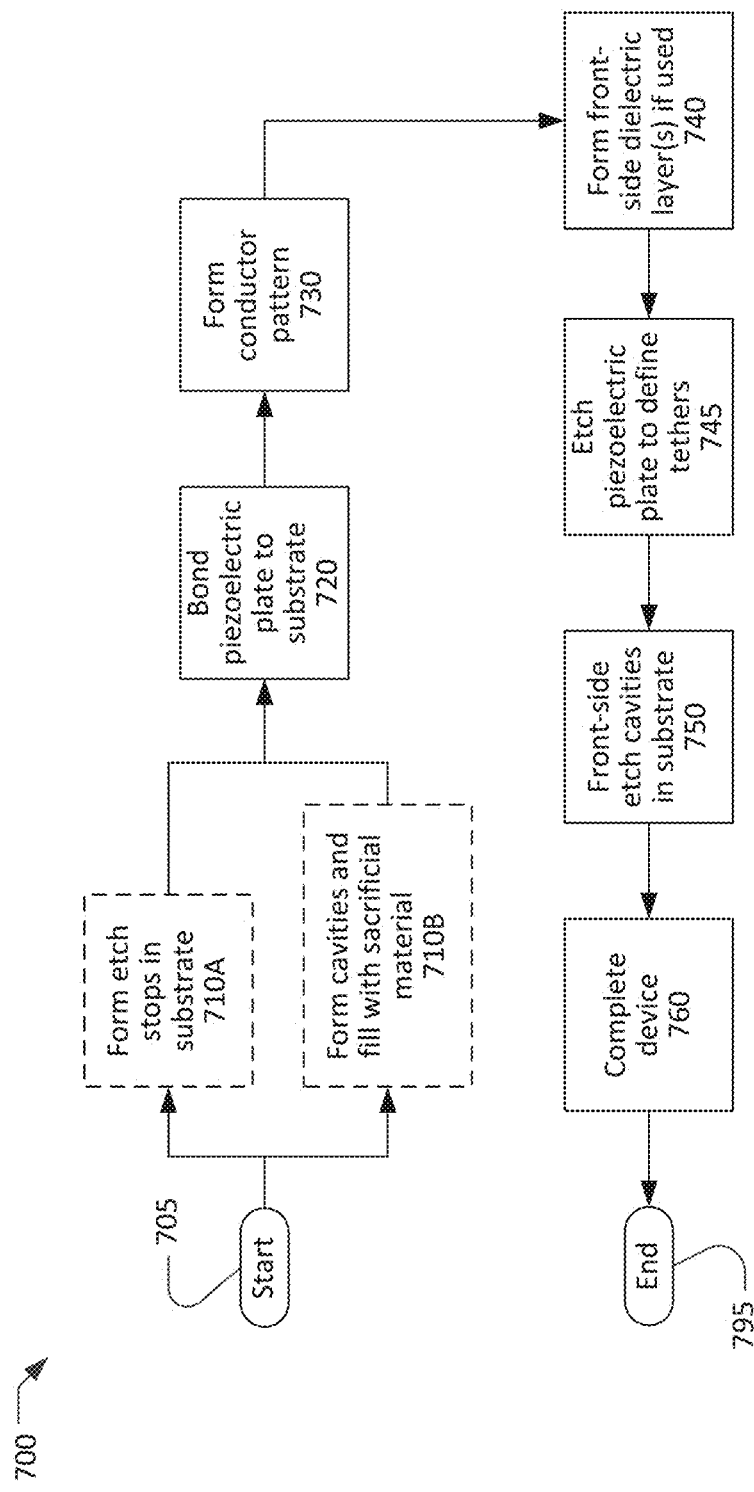
FIG. 7 is flow chart of a method for fabricating an XBAR with a tether-supported diaphragm.

FIG. 7 is a simplified flow chart of a process 700 for making an XBAR with a tether-supported diaphragm or a filter incorporating such XBARs. The process 700 starts at 705 with a substrate and a plate of piezoelectric material and ends at 795 with a completed XBAR or filter. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

The piezoelectric plate may be, for example, lithium niobate or lithium tantalate. The piezoelectric plate may be Z-cut, rotated Z-cut, or rotated YX-cut. The piezoelectric plate may be some other material and/or some other cut. The substrate may be a silicon wafer or a silicon on insulator wafer. The substrate may be a wafer of some other material that allows formation of deep cavities by etching or other processing.

The substrate and the piezoelectric plate will be bonded together at 720. Prior to bonding, optional steps may be taken to prepare the substrate. For example, at 710A, lateral and/or vertical etch stops may be formed in the substrate. A lateral etch stop is a structure to constrain the lateral extend of a subsequently etched cavity. A vertical etch stop is a structure to limit the depth of a subsequently etched cavity. Lateral and vertical etch stops may be formed in the substrate as described in pending patent application Ser. No. 16/913,417, titled TRANSVERSELY-EXCITED FILM BULK ACOUSTIC RESONATOR WITH LATERAL ETCH STOP, which is incorporated herein by reference. Alternatively, at 710B, the cavities may be formed in the substrate and then filled with a sacrificial material that will be subsequently removed.

At 720, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 730 by depositing and patterning one or more conductor layer on the front side of the piezoelectric plate. The conductor layers may be, for example, aluminum, an aluminum alloy, copper, a copper alloy, titanium, chrome, tungsten, molybdenum, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between a conductor layer and the piezoelectric plate. The conductor pattern formed at 730 includes the first metal level 362 of the IDT fingers, the tethers, and the busbars. The conductor pattern formed at 730 may also include the second conductor level 364 to improve the electrical and thermal conductivity of portions of the conductor pattern (for example the IDT busbars and interconnections between the IDTs).

The conductor pattern may be formed at 730 by depositing the conductor layers and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 730 using a lift-off process. Photoresist may be deposited over the piezoelectric plate. and patterned to define the conductor pattern. The conductor layers and, optionally, one or more other layers may be deposited in sequence over the surface of the piezoelectric plate. The photoresist may then be removed, which removes the excess material, leaving the conductor pattern.

The two metal levels 362, 364 (shown in FIGS. 3A and 3B) and/or layers within either metal level may be deposited and patterned using different processes.

At 740, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

After the conductor pattern and dielectric layers are formed, the tethers may be defined at 745 by etching the piezoelectric plate between the tethers and around the perimeter of the diaphragm.

One or more cavities are then formed in the substrate at 750. A separate cavity may be formed for each resonator in a filter device. For example, the one or more cavities may be formed by etching the substrate using an etchant introduced through openings in the piezoelectric plate formed at 745. A separate cavity may be formed for each resonator in a filter device. The extent of the cavities may be defined by lateral and/or vertical etch stops previously formed in the substrate at 710A. Alternatively, the cavities may be formed at 750 by etching or otherwise removing the sacrificial material filling the cavities previously formed at 710B.

In all variation of the process 700, the filter device is completed at 760. Actions that may occur at 760 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 760 is to tune the resonant frequencies of the resonators within the device by adding or removing metal or dielectric material from the front side of the device. After the filter device is completed, the process ends at 795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
  a substrate;
  at least one piezoelectric plate, a first portion of the at least one piezoelectric plate on the substrate, and a second portion of the at least one piezoelectric plate forming a diaphragm suspended over a cavity;
  an interdigital transducer (IDT) on a surface of the at least one piezoelectric plate, the IDT comprising first and second busbars at least partially on the first portion and interleaved IDT fingers on the diaphragm; and
  a plurality of tethers, each tether connecting a corresponding one of the interleaved IDT fingers to one of the first and second busbars.

2. The acoustic resonator device of claim 1, wherein each tether provides one of a thermal connection or a flexible connection between a corresponding one of the interleaved IDT fingers and one of the first and second busbars.

3. The acoustic resonator device of claim 1, wherein
  the first and second busbars are on opposite sides of the cavity, and
  the interleaved IDT fingers are connected to the first and second busbars, alternately.

4. The acoustic resonator device of claim 1, wherein
  the interleaved IDT fingers comprise a first conductor level,
  each tether of the plurality of tethers comprises the first conductor level and a corresponding section of the at least one piezoelectric plate connecting the first portion and the diaphragm, and
  each of the first and second busbars comprises the first conductor level and a second conductor level.

5. The acoustic resonator device of claim 1, wherein
  a portion of each tether of the plurality of tethers forms an oblique angle with a long direction of the corresponding interleaved IDT finger, and
  the oblique angle is greater than or equal to 30 degrees and less than or equal to 60 degrees.

6. The acoustic resonator device of claim 1, wherein
  each tether of the plurality of tethers is continuously curved, and
  a width of each tether of the plurality of tethers is greater than a width of the corresponding IDT finger.

7. The acoustic resonator device of claim 1, wherein each tether of the plurality of tethers comprises:
  a first segment extending from the first or second busbar;
  a third segment extending from the diaphragm colinear with a corresponding IDT finger; and
  a second segment joining the first segment and the third segment, the second segment forming an oblique angle with a long direction of the corresponding IDT finger.

8. An acoustic resonator device comprising:
  at least one piezoelectric plate on a substrate, a portion of the at least one piezoelectric plate forming a diaphragm suspended over a cavity;
  an interdigital transducer (IDT) on the at least one piezoelectric plate, the IDT comprising interleaved IDT fingers on the diaphragm and first and second busbars not on at least a portion of the diaphragm; and
  a plurality of tethers, each tether connecting a corresponding one of the interleaved IDT fingers and one of the first and second busbars by spanning an open space between the diaphragm and the one of the first and second busbars.

9. The acoustic resonator device of claim 8, wherein each tether provides one of a thermal connection or a flexible connection between a corresponding one of the interleaved IDT fingers and one of the first and second busbars.

10. The acoustic resonator device of claim 8, wherein
  the first and second busbars are on opposite sides of the cavity, and
  the interleaved IDT fingers are connected to the first or second busbar, alternately.

11. The acoustic resonator device of claim 8, wherein
  the interleaved IDT fingers comprise a first conductor level,
  each tether of the plurality of tethers comprises the first conductor level and a corresponding portion of the at least one piezoelectric plate, and
  each of the first and second busbars comprises the first conductor level and a second conductor level.

12. The acoustic resonator device of claim 8, wherein
  a section of each tether of the plurality of tethers forms an oblique angle with a long direction of the corresponding interleaved IDT finger, and
  the oblique angle is greater than or equal to 30 degrees and less than or equal to 60 degrees.

13. The acoustic resonator device of claim 8, wherein each tether of the plurality of tethers comprises:
  a first segment extending from the first or second busbar;
  a third segment extending from the diaphragm colinear with the corresponding IDT finger; and
  a second segment joining the first segment and the third segment, the second segment forming the oblique angle with the long direction of the corresponding interleaved IDT finger.

14. The acoustic resonator device of claim 8, wherein
  each tether of the plurality of tethers is continuously curved, and
  a width of each tether of the plurality of tethers is greater than a width of the corresponding interleaved IDT finger.

15. An acoustic resonator device comprising:
  a substrate;
  at least one piezoelectric plate, a first portion of the at least one piezoelectric plate on the substrate, and a second portion of the at least one piezoelectric plate forming a diaphragm suspended over a cavity;
  an interdigital transducer (IDT) on a surface of the at least one piezoelectric plate, the IDT comprising:
    first and second busbars at least partially on the first portion;
    interleaved IDT fingers on the diaphragm; and
    a plurality of tethers on the second portion of the at least one piezoelectric plate, each tether providing a flexible connection between a corresponding one of the interleaved IDT fingers and one of the first and second busbars.

16. The acoustic resonator device of claim 15, wherein each tether provides one of a mechanically supporting connection, a thermal connection or an electrical connection between a corresponding one of the interleaved IDT fingers and one of the first and second busbars.

17. The acoustic resonator device of claim 15, wherein
the first and second busbars are on opposite sides of the cavity, and
the interleaved IDT fingers are connected to the first or second busbar, alternately.

18. The acoustic resonator device of claim 15, wherein
the interleaved IDT fingers comprise a first conductor level,
each tether of the plurality of tethers comprises the first conductor level and a corresponding portion of the at least one piezoelectric plate, and
each of the first and second busbars comprises the first conductor level and a second conductor level.

19. The acoustic resonator device of claim 15, wherein
a section of each tether of the plurality of tethers forms an oblique angle with a long direction of the corresponding interleaved IDT finger, and
the oblique angle is greater than or equal to 30 degrees and less than or equal to 60 degrees.

20. The acoustic resonator device of claim 15, wherein
each tether of the plurality of tethers is continuously curved, and
a width of each tether of the plurality of tethers is greater than a width of the corresponding interleaved IDT finger.

* * * * *